(12) United States Patent
Krishnamurthi et al.

(10) Patent No.: US 11,005,424 B2
(45) Date of Patent: May 11, 2021

(54) POWER EFFICIENT AMPLIFIER

(71) Applicant: BAE Systems Information and Electronic Systems Integration Inc., Nashua, NH (US)

(72) Inventors: Kathiravan Krishnamurthi, Westford, MA (US); Souleymane Gnanou, Salem, NH (US); Douglas S. Jansen, Pelham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 146 days.

(21) Appl. No.: 16/453,152

(22) Filed: Jun. 26, 2019

(65) Prior Publication Data

US 2020/0412301 A1 Dec. 31, 2020

(51) Int. Cl.
*H03F 3/45* (2006.01)
*H03F 1/02* (2006.01)
*H03F 1/56* (2006.01)
*H03G 3/30* (2006.01)
*H03F 3/68* (2006.01)

(52) U.S. Cl.
CPC ......... *H03F 1/0211* (2013.01); *H03F 1/565* (2013.01); *H03F 3/45085* (2013.01); *H03F 3/68* (2013.01); *H03G 3/3036* (2013.01); *H03F 2200/222* (2013.01); *H03F 2200/273* (2013.01); *H03F 2200/387* (2013.01); *H03F 2200/451* (2013.01); *H03F 2200/541* (2013.01); *H03F 2203/45298* (2013.01); *H03F 2203/45316* (2013.01); *H03F 2203/45352* (2013.01); *H03G 2201/103* (2013.01); *H03G 2201/307* (2013.01)

(58) Field of Classification Search
CPC ... H03F 1/22; H03F 1/223; H03F 3/45; H03F 2200/537
USPC .................................. 330/165, 254, 311, 252
See application file for complete search history.

(56) References Cited

U.S. PATENT DOCUMENTS

| 8,378,744 | B2 * | 2/2013 | Koo | ......................... | H03F 3/245 |
| | | | | | 330/51 |
| 8,766,723 | B1 * | 7/2014 | Loeb | ....................... | H03F 3/265 |
| | | | | | 330/276 |
| 10,911,005 | B2 | 2/2021 | Krishnamurthi | | |

* cited by examiner

*Primary Examiner* — Steven J Mottola
(74) *Attorney, Agent, or Firm* — Sand, Sebolt Wernow LPA; Scott J. Asmus

(57) ABSTRACT

A power efficient (PE) amplifier includes a cascode amplifier, a transistor amplifier, and a voltage supply. The transistor amplifier includes at least one differential pair of transistors and a plurality of transformers having a primary winding and a tapped secondary winding. The secondary winding is connected across emitters or sources of each transistor pair. The tap of each secondary has a current source. The primary windings of the plurality of transformers are connected in series. The transistor bases or gates are alternating current (AC) grounded. The collector or drain terminal pairs are connected in parallel. The voltage supply is low voltage and supplies a current to the cascode amplifier. The PE amplifier further includes a plurality of current sources which provide a total current to the transistor amplifier. The PE amplifier has, among other things, improved power gain, improved reverse isolation, improved power dissipation, and improved peak differential swing.

20 Claims, 4 Drawing Sheets

POWER EFFICIENT AMPLIFIER

TECHNICAL FIELD

The present disclosure relates to systems and methods for amplifier systems. More particularly, the present disclosure relates to power efficient (PE) amplifiers. Specifically, the present disclosure relates to low voltage PE amplifiers including a cascode amplifier and a common base (CB) or common gate (CG) transistor amplifier.

BACKGROUND

Cascode amplifiers are two-stage amplifiers that include a common-emitter stage feeding into a common-base stage or a common source stage feeding into a common gate stage. Cascode amplifiers are constructed from two transistors, bipolar junction transistors (BJTs) or field effect transistors (FETs), with one operating as a common emitter or common source and the other as a common base or common gate. The low input impedance of a common base or common gate amplifier eliminates the Miller effect, improves input-output isolation and also contributes to a higher bandwidth. However, one shortcoming associated with cascode amplifiers is a result of requiring two transistors for operation, which, in turn, requires a relatively high supply voltage for operation. For example, in a two-FET cascode amplifier, both transistors must be biased with ample drain-source voltage ($V_{DS}$) in operation, which imposes a lower limit on the supply voltage.

SUMMARY

There remains a need in the art for an improved power efficient (PE) amplifier. The present disclosure addresses these and other issues.

In one aspect, an exemplary embodiment of the present disclosure may provide a power efficient (PE) amplifier comprising a cascode amplifier; a common base (CB) transistor amplifier; and at least one voltage supply. The CB transistor amplifier comprises a plurality of transformers; wherein each of the plurality of transformers includes a primary and a secondary; wherein each primary is connected in series; wherein each secondary includes a secondary center tap; at least one differential pair of transistors; wherein each transistor of each of the at least one differential pair of transistors includes a base terminal, an emitter terminal, and a collector terminal; wherein one secondary of the plurality of transformers is connected across the emitter terminals of each of the transistors of each of the at least one differential pair of transistors; wherein the collector terminals of each of the transistors of each of the at least one differential pair of transistors are connected in parallel; a primary center tap in the series connection of the plurality of transformers; wherein the at least one voltage supply is connected to the primary center tap; wherein the at least one voltage supply supplies at least one first current to the cascode amplifier from the primary center tap; and a plurality of current sources providing a total CB transistor amplifier current; wherein each secondary tap of the plurality of transformers is connected to one of the plurality of current sources; and wherein each secondary carries a fraction of the total CB transistor amplifier current.

In one example, the at least one voltage supply includes a voltage of approximately three volts and the PE amplifier includes a three volt peak differential swing equal to the voltage of the at least one voltage supply.

In one example, the total CB transistor amplifier current is split substantially equally between each transistor of each of the at least one differential pair of transistors.

The PE amplifier further includes an input impedance presented by the CB transistor amplifier and an output impedance presented by the cascode amplifier. In one example, the input impedance presented by the CB transistor amplifier is substantially matched to the output impedance of the cascode amplifier.

The PE amplifier further includes a gain and at least one switching mechanism. The at least one switching mechanism switches on and off to vary the gain. The PE amplifier further includes an input impedance and an output impedance. In one example, when the gain varies the input impedance and the output impedance of the PE amplifier remains unchanged.

In one example, the PE amplifier further includes a radio frequency (RF) source impedance. The at least one switching mechanism is operatively coupled to the cascode amplifier and operatively coupled to the CB transistor amplifier. The at least one switching mechanism is configured to selectively bypass the cascode amplifier. When the cascode amplifier is bypassed, the input impedance presented by the CB transistor amplifier is substantially matched to the RF source impedance. When the cascode amplifier is bypassed, the output impedance presented by the CB transistor amplifier remains unchanged.

In another aspect, an exemplary embodiment of the present disclosure may provide a power efficient (PE) amplifier comprising a cascode amplifier; a common gate (CG) transistor amplifier; and at least one voltage supply. The CB transistor amplifier comprises a plurality of transformers; wherein each of the plurality of transformers includes a primary and a secondary; wherein each primary is connected in series; wherein each secondary includes a secondary center tap; at least one differential pair of transistors; wherein each transistor of each of the at least one differential pair of transistors includes a gate terminal, a source terminal, and a drain terminal; wherein one secondary of the plurality of transformers is connected across the source terminals of each of the transistors of each of the at least one differential pair of transistors; wherein the drain terminals of each of the transistors of each of the at least one differential pair of transistors are connected in parallel; a primary center tap in the series connection of the plurality of transformers; wherein the at least one voltage supply is connected to the primary center tap; wherein the at least one voltage supply supplies at least one first current to the cascode amplifier from the primary center tap; and a plurality of current sources providing a total CG transistor amplifier current; wherein each secondary center tap of the plurality of transformers is connected to one of the plurality of current sources; and wherein each secondary carries a fraction of the total CG transistor amplifier current.

In one example, the at least one voltage supply includes a voltage of approximately three volts and the PE amplifier includes a three volt peak differential swing equal to the voltage of the at least one voltage supply.

In one example, the total CG transistor amplifier current is split substantially equally between each transistor of each of the at least one differential pair of transistors.

The PE amplifier further includes an input impedance presented by the CG transistor amplifier and an output impedance presented by the cascode amplifier. In one example, the input impedance presented by the CG transistor amplifier is substantially matched to the output impedance of the cascode amplifier.

The PE amplifier further includes a gain and at least one switching mechanism. The at least one switching mechanism switches on and off to vary the gain. The PE amplifier further includes an input impedance and an output impedance. In one example, when the gain varies the input impedance and the output impedance of the PE amplifier remains unchanged.

In one example, the PE amplifier further includes a radio frequency (RF) source impedance. The at least one switching mechanism is operatively coupled to the cascode amplifier and operatively coupled to the CG transistor amplifier. The at least one switching mechanism is configured to selectively bypass the cascode amplifier. When the cascode amplifier is bypassed, the input impedance presented by the CG transistor amplifier is substantially matched to the RF source impedance. When the cascode amplifier is bypassed, the output impedance presented by the CG transistor amplifier remains unchanged.

In yet another aspect, an exemplary embodiment of the present disclosure may provide a power efficient (PE) amplifier including a cascode amplifier, a transistor amplifier, and a voltage supply. The transistor amplifier includes at least one differential pair of transistors and a plurality of transformers having a primary winding and a tapped secondary winding. The secondary winding is connected across emitters or sources of each transistor pair. The tap of each secondary has a current source. The primary windings of the plurality of transformers are connected in series. The transistor bases or gates are alternating current (AC) grounded. The collector or drain terminal pairs are connected in parallel. The voltage supply is low voltage and supplies a current to the cascode amplifier. The PE amplifier further includes a plurality of current sources which provide a total current to the transistor amplifier. The PE amplifier has, among other things, improved power gain, improved reverse isolation, improved power dissipation, and improved peak differential swing.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
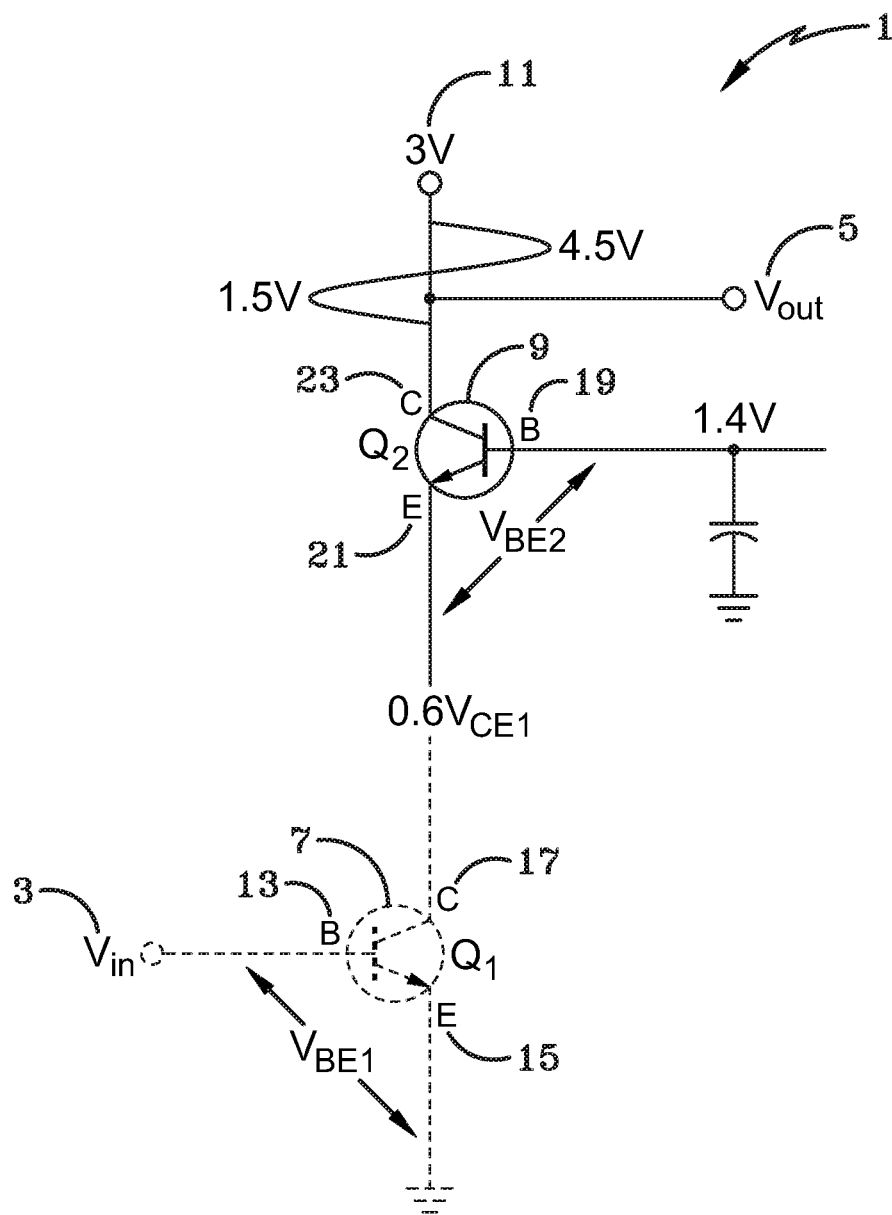
FIG. 1 is a schematic view of an exemplary cascode amplifier having a supply voltage of three volts and an operating point configured to swing a one and a half voltage peak alternating current (AC)

FIG. 1 illustrates a schematic view of an exemplary cascode amplifier 1 having a supply voltage of three volts and an operating point configured to swing a one and a half voltage peak alternating current (AC). The cascode amplifier 1 includes an input port 3, which may also be referred to as $V_{in}$, an output port 5, which may also be referred to as $V_{out}$, a first transistor 7, which may also be referred to as $Q_1$, a second transistor 9, which may be referred to as $Q_2$, and a voltage supply 11. The bottom half of the cascode amplifier 1, including the second transistor $Q_2$, is shown in dashed lines, as this configuration does not allow the first transistor $Q_1$ to operate linearly as further described below.

The first transistor $Q_1$ includes a base terminal 13, an emitter terminal 15, and a collector terminal 17. The second transistor $Q_2$ includes a base terminal 19, an emitter terminal 21, and a collector terminal 23. The emitter terminal 15 of the first transistor $Q_1$ is AC grounded, and, therefore, the first transistor $Q_1$ may be referred to as a common emitter (CE) transistor. The base terminal 19 of the second transistor $Q_2$ is AC grounded, and, therefore, the second transistor $Q_2$ may be referred to as a common base (CB) transistor.

The cascode amplifier 1 further includes an output voltage swing which is limited by the voltage supply 11, breakdown limitations of the first transistor $Q_1$ and the second transistor $Q_2$, a first base-emitter voltage drop $V_{BE1}$, and a second base-emitter voltage drop $V_{BE2}$. As such, the cascode amplifier 1 is limited by the voltage headroom, which is defined as the maximum voltage that the cascode amplifier 1 can swing after the voltage drops $V_{BE1}$ and $V_{BE2}$ have occurred, when the cascode amplifier 1 needs to swing high output voltages. As shown in FIG. 1, the voltage drop $V_{BE1}$ across the base 19 of the second transistor $Q_2$ and the emitter 21 of the second transistor $Q_2$ is 0.8 volts, the voltage between the base 19 of the second transistor $Q_2$ and the ground is 1.4 volts, and the collector-emitter voltage $V_{CE1}$ of the first transistor $Q_1$ is 0.6 volts, which is close to the saturation voltage of the first transistor $Q_1$ of 0.3 volts. As such, the collector-emitter voltage $V_{CE1}$ of the first transistor $Q_1$, which is 0.6 volts, is too low for the first transistor $Q_1$ to operate linearly. This limits the amount of voltage swing offered by the cascode amplifier 1 to less than 1.5 volts. The voltage headroom issue becomes more problematic, (i.e., severe), with FET cascode amplifiers, such as gallium arsenide (GaAs) pseudomorphic high-electron mobility transistor pHEMT and gallium nitride (GaN) devices, where the knee voltage, which may also be referred to as the turn-on voltage, is typically high, such as, for example, greater than one volt for pHEMT devices and as high as five volts for GaN devices.

Figure 2:
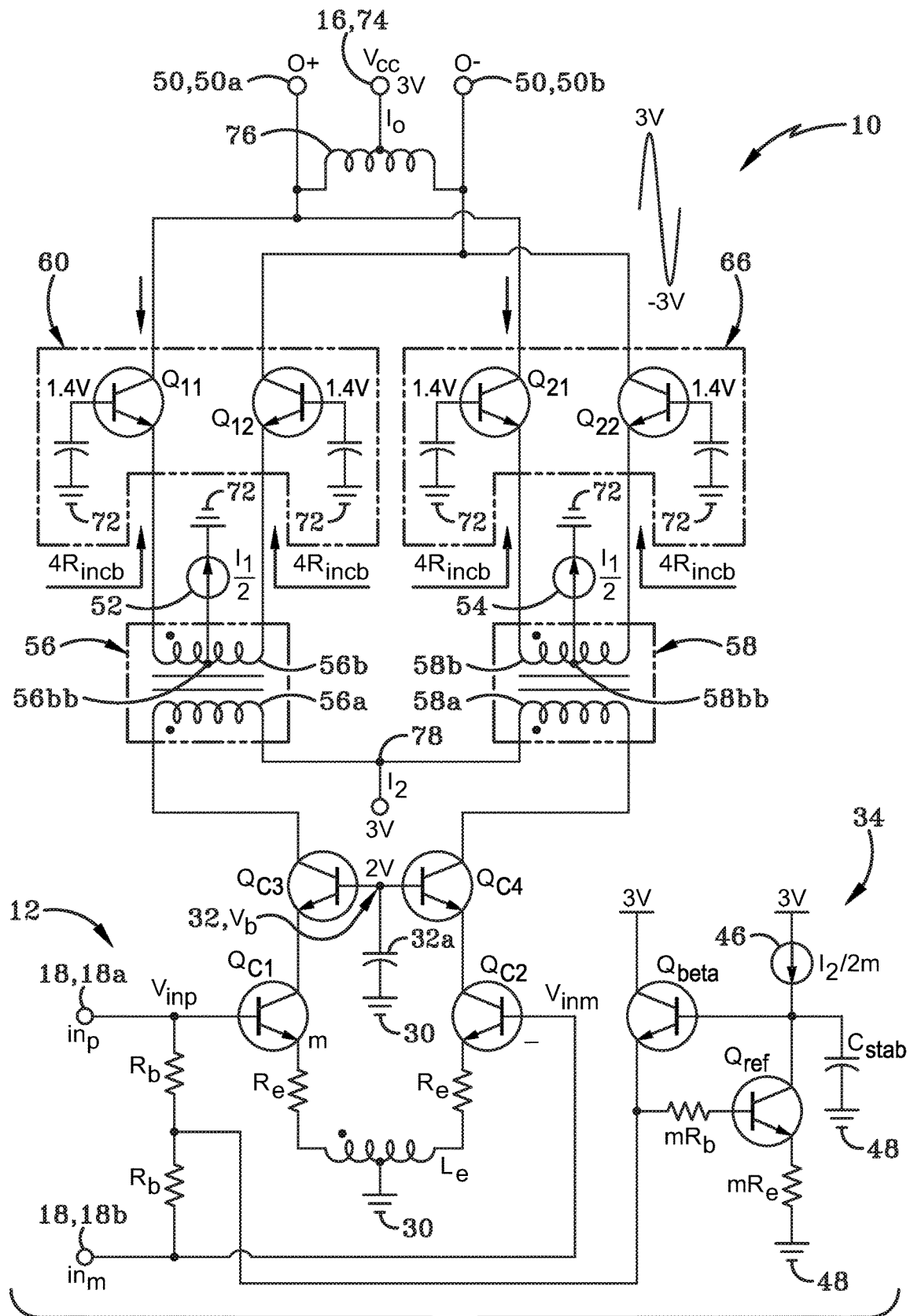
FIG. 2 is a schematic view of a first embodiment of a power efficient (PE) amplifier in accordance with one aspect of the present disclosure.

FIG. 2 is a schematic view of a first embodiment of a power efficient (PE) amplifier 10, which may also be referred to as a PE radio frequency (RF) amplifier, in accordance with one aspect of the present disclosure. The PE amplifier 10 includes a cascode amplifier 12, which may also be referred to as a broadband low-swing amplifier 12, a common-base (CB) transistor amplifier 14, and a load mechanism 16.

In one particular embodiment, the broadband low-swing amplifier 12 is a low-swing cascode amplifier, which is also denoted as 12. The low-swing cascode amplifier 12 may also be referred to as a pre-driver cascode amplifier. The low-swing cascode amplifier 12 includes a differential input terminal 18 having a positive input terminal 18a, which may also be referred to as $in_p$, and a negative input terminal 18b, which may also be referred to as $in_m$. The low-swing cascode amplifier 12 further includes a first transistor 20, which may also be referred to as $Q_{C1}$, a second transistor 22, which may also be referred to as $Q_{C2}$, a third transistor 24, which may also be referred to as $Q_{C3}$, and a fourth transistor 26, which may also be referred to as $Q_{C4}$. The first transistor $Q_{C1}$ and the second transistor $Q_{C2}$ form a CE transistor pair and the third transistor $Q_{C3}$ and the fourth transistor $Q_{C4}$ form a CB transistor pair. The low-swing cascode amplifier 12 further includes a plurality of base resistors, which may be referred to as $R_b$, a plurality of emitter resistors, which may be referred to as $R_e$, a capacitor $C_1$, an emitter inductor 28, which may also be referred to as $L_e$, a plurality of grounds 30, a voltage bias circuit 32, which may also be referred to as $V_b$, and a bias circuit 34.

The voltage bias circuit 32 includes a capacitor 32a connected to one of the plurality of grounds 30. The bias circuit 34 includes a first transistor 36, which may also be referred to as $Q_{beta}$, a second transistor 38, which may also be referred to as unit transistor $Q_{ref}$, a stability capacitor 40, which may also be referred to as $C_{stab}$, a base resistor 42, which may also be referred to as $mR_b$, an emitter resistor 44, which may also be referred to as $mR_e$, a reference current source 46, and a plurality of grounds 48.

The positive input terminal 18a is connected to the base of the first transistor $Q_{C1}$. The area of the first transistor $Q_{C1}$ is equal to m times the emitter area of the unit transistor $Q_{ref}$, where m is a scale factor. The negative input terminal 18b is connected to the base of the second transistor $Q_{C2}$. The area of the second transistor $Q_{C2}$ is equal to m times the emitter area of the unit transistor $Q_{ref}$. The base resistors $R_b$ are connected across the differential input terminal 18. The bias circuit 34 is connected between the base resistors $R_b$.

The emitter of the first transistor $Q_{C1}$ is connected to one of the emitter resistors $R_e$ which, in turn, is connected to the emitter inductor $L_e$. The emitter inductor $L_e$ is connected to one of the plurality of grounds 30. The emitter of the second transistor $Q_{C2}$ is connected to another of the emitter resistors $R_e$ which, in turn, is connected to the emitter inductor $L_e$.

The collector of the first transistor $Q_{C1}$ is connected to the emitter of the third transistor $Q_{C3}$. The collector of the second transistor $Q_{C2}$ is connected to the emitter of the fourth transistor $Q_{C4}$. The base of the third transistor $Q_{C3}$ is connected to the base of the fourth transistor $Q_{C4}$ and the voltage bias circuit 32. The collector of the third transistor $Q_{C3}$ and the collector of the fourth transistor $Q_{C4}$ are connected to the CB transistor amplifier 14 as more fully described below.

The reference current source 46 of the bias circuit 34, which is $I_2/2m$, is connected to the voltage supply 74, the base of the first transistor $Q_{beta}$, the collector of the unit transistor $Q_{ref}$, and to the stability capacitor $C_{stab}$. The stability capacitor $C_{stab}$ is connected to one of the plurality of grounds 48. The collector of the first transistor $Q_{beta}$ is connected to the voltage supply 74. The emitter of the first transistor $Q_{beta}$ is connected to the base of the unit transistor $Q_{ref}$ via $mR_b$ to feed the base current to the unit transistor $Q_{ref}$ and the pre-driver cascode amplifier 12.

The CB transistor amplifier 14, which may also be referred to as a two-cell CB transistor amplifier, includes a differential voltage output terminal 50 having a first output terminal 50a and a second output terminal 50b, a first current source 52, which is $I_1/2$, a second current source 54, which is $I_1/2$, a first transformer 56, a second transformer 58, a first differential pair of transistors 60 having a first transistor 62, which may also be referred to as $Q_{11}$ and a second transistor 64, which may also be referred to as $Q_{12}$, a second differential pair of transistors 66 having a third transistor 68, which may also be referred to as $Q_{21}$ and a fourth transistor 70, which may also be referred to as $Q_{22}$, and a plurality of grounds 72. The first differential pair of transistors 60 may also be referred to as a first CB cell and the second differential pair of transistors 66 may also be referred to as a second CB cell.

The first transformer 56 includes a primary 56a and a secondary 56b which includes a center tap 56bb. The second transformer 58 includes a primary 58a and a secondary 58b which includes a center tap 58bb. In one example, the first transformer 56 and the second transformer 58 are 1:1 planar transformers; however, any suitable transformers may be utilized, such as, for example, planar spiral transformers, wire-wound transformers, slab transformers, and the like. It should be noted that the selection of the type of transformers may be dependent, at least in part, on the desired operational frequencies of the PE amplifier 10 of the present disclosure.

The first transistor $Q_{11}$ of the first differential pair of transistors 60, the second transistor $Q_{12}$ of the first differential pair of transistors 60, the third transistor $Q_{21}$ of the second differential pair of transistors 66 and the fourth transistor $Q_{22}$ of the second differential pair of transistors 66 are bipolar junction transistors (BJTs); however, the first transistor $Q_{11}$ of the first differential pair of transistors 60, the second transistor $Q_{12}$ of the first differential pair of transistors 60, the third transistor $Q_{21}$ of the second differential pair of transistors 66, and the fourth transistor $Q_{22}$ of the second differential pair of transistors 66 may be any suitable transistors, including, but not limited to n-type field effect transistors (nFETs), pseudomorphic high-electron mobility transistors (pH EMTs), metal-semiconductor field-effect transistors (MESFETs) and gallium nitride (GaN) transistors.

The load mechanism 16 includes a voltage supply 74 and an inductor 76. Although a certain load mechanism 16 has been described, it is to be entirely understood that different load mechanisms may be utilized.

The primary 56a of the first transformer 56 is connected to the collector of the third transistor $Q_{C3}$ and the primary 58a of the second transformer 58 in series. The primary 58a of the second transformer 58 is connected to one of the collector of the fourth transistor $Q_{C4}$. The voltage supply 74 is connected between the primary 56a of the first transformer 56 and the primary 58a of the second transformer 58 at a primary tap 78 between the first transformer 56 and the second transformer 58 to provide a voltage to the low-swing cascode amplifier 12.

The secondary 56b of the first transformer 56 is connected to the emitter of the first transistor $Q_{11}$, the emitter of the second transistor $Q_{12}$, and the first current source 52 via center tap 56bb. The first current source 52 is connected to one of the plurality of grounds 72. The base of the first transistor $Q_{11}$ is connected to one of the plurality of grounds 72. The base of the second transistor $Q_{12}$ is connected to one of the plurality of grounds 72.

The secondary 58b of the second transformer 58 is connected to the emitter of the third transistor $Q_{21}$, the emitter of the fourth transistor $Q_{22}$, and the second current source 54 via center tap 58bb. The second current source 54 is connected to one of the plurality of grounds 72. The base of the third transistor $Q_{21}$ is connected to one of the plurality of grounds 72. The base of the fourth transistor $Q_{22}$ is connected to one of the plurality of grounds 72.

The collector of the first transistor $Q_{11}$ is connected to the collector of the third transistor $Q_{21}$ and the first output terminal 50a in parallel. The collector of the second transistor $Q_{12}$ is connected to the collector of the fourth transistor $Q_{22}$ and the second output terminal 50b in parallel. The inductor 76 is connected to the first output terminal 50a, the second output terminal 50b, and the voltage supply 74.

In operation, an RF source applies an RF input signal to the pre-driver cascode amplifier 12 which is matched to the RF source. The load of the pre-driver cascode amplifier 12 is $16V_T/I_1$. The current $I_2$ through the pre-driver cascode amplifier 12 is optimized to achieve enough swing to drive the CB transistor amplifier 14, which may also be referred to as an output CB stage, to desired peak levels. Unlike a conventional cascode amplifier, which has to reuse current through the CB transistor, the PE amplifier 10 of the present disclosure does not have to reuse the current through the CB transistor amplifier 14. The CB transistor amplifier 14 also achieves a greater voltage swing compared to a conventional cascode amplifier while only utilizing a voltage supply of three volts where the conventional cascode amplifier typically utilizes a voltage supply of at least five volts.

Although the CB transistor amplifier 14 has been described as a two-cell CB transistor amplifier, it is to be entirely understood that the CB transistor amplifier 14 may utilize any suitable number of n cells. Instead of having two-cells, the CB transistor amplifier 14 may have n number of CB cells, where n is any suitable integer. In this scenario, the n number of cells is connected in a similar manner as described in FIG. 2. The load of the pre-driver cascode amplifier 12 is $4n^2V_T/I_1$ and is set by the number n of cells in the CB transistor amplifier 14 and the current $I_1$. The input impedance for the n-cell CB transistor amplifier can be calculated according to the following equation:

$$R_{incbncell} = \frac{4n^2V_T}{I_1}. \quad \text{Equation (1)}$$

While the input signal voltage is shared substantially evenly between the n cells, the output currents of the n cells are combined by connecting the outputs of the n cells together. This configuration decreases the output impedance of the n cells to facilitate output matching. In addition to the improved input impedance matching capability of the n cell CB transistor amplifier, signal splitting between the n cells also increases the input intercept point (IP3) compared to other circuit topologies. The IP3 represents how efficiently a transistor amplifier processes signals without distortion. In other words, the IP3 is a figure of merit for a RF/microwave radio component. The IP3 also represents how much of a range, for example, power in milliwatts (mW) or decibel-milliwatts (dBms), that the component is able to suitably process without distortion. Only a small portion of the input drive, which is A_RF/n, excites each n cell of the CB transistor amplifier. This is described by a transfer function in accordance with the following equation:

$$V_{cbno} = R_L I_1 \sinh\left[\frac{A_{RF}\cos(\omega_{RF}t)}{2nV_T}\right] \quad \text{Equation (2)}$$

where $A_{RF}\cos(\omega_{RF} t)$ is the sinusoidal input to the n cell CB transistor amplifier, and $A_{RF}$ is the voltage amplitude. The expression is an odd function of the input voltage and results only in odd order harmonics. This is one of the advantages of the n cell CB transistor amplifier of the present disclosure. The output voltage produced by Equation (2) can be expanded via a Taylor series, which is a representation of a function as an infinite sum of terms that are calculated from the values of the function's derivatives at a single point, and the third order input intercept point voltage, $V_{IIP3}$, of the n cell CB transistor amplifier according to the following equation:

$$V_{IIP3} = 4n\sqrt{2}V_T \quad \text{Equation (3)}.$$

Figure 3:
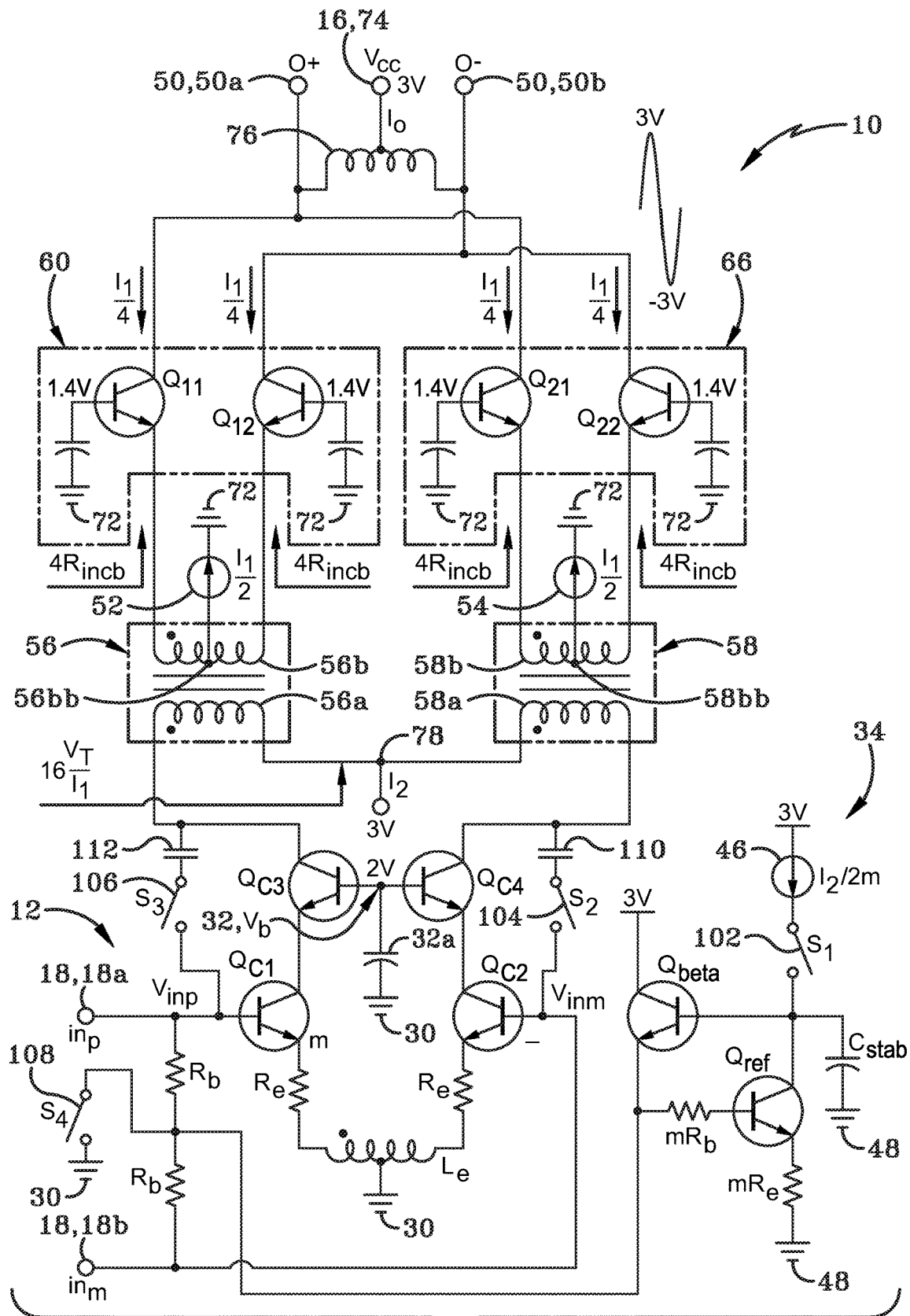
FIG. 3 is a schematic view of a second embodiment of a PE amplifier in accordance with one aspect of the present disclosure.

FIG. 3 is a schematic view of a second embodiment of a PE amplifier 100, which may also be referred to as a PE radio frequency (RF) amplifier, in accordance with one aspect of the present disclosure. The PE amplifier 100 is substantially identical to the PE amplifier 10 in structure and function with a few exceptions/additions that will be discussed hereafter in greater detail. The PE amplifier 100 further includes a first switching mechanism 102, a second switching mechanism 104, a third switching mechanism 106, a fourth switching mechanism 108, a first series capacitor 110, and a second series capacitor 112.

The first switching mechanism 102 is connected between the reference current source 46, the stability capacitor $C_{stab}$, the base of the first transistor $Q_{beta}$ and the collector of the second transistor $Q_{ref}$. The first series capacitor 110 is connected between the primary 58a of the second transformer 58 and the second switching mechanism 104. The second switching mechanism 104 is connected between the first series capacitor 110 and the negative input terminal 18b. The second series capacitor 112 is connected between the primary 56a of the first transformer 56 and the third switching mechanism 106. The third switching mechanism 106 is connected between the first series capacitor 112 and the positive input terminal 18a. The fourth switching mechanism 108 is connected between the base resistors $R_b$ and one of the plurality of grounds 30.

In operation, the PE amplifier 100 is configured to operate in a first mode and a second mode. More particularly, when the PE amplifier 100 is operating in the first mode, the first switching mechanism is closed or in an "on" position and the second switching mechanism 104, the third switching mechanism 106, and the fourth switching mechanism 108 are open or in an "off" position. When the PE amplifier 100 is operating in the second mode, the first switching mechanism is open or in an "off" position and the second switching mechanism 104, the third switching mechanism 106, and the fourth switching mechanism 108 are closed or in an "on" position.

Therefore, when the PE amplifier 100 operates in the first mode, the voltage gain $A_V$, which is a ratio of the output voltage over the input voltage, is equal to $A_{v1}A_{v2}$, where $A_{v1}$, which represents the voltage gain of the low-swing cascode amplifier 12, is given by the following equation:

$$A_{v1} = I_2(16V_T)/V_T(I_1) = 16I_2/I_1 \quad \text{Equation (4)}$$

where $I_2$ is the current through the pre-driver cascode amplifier 12, $V_T$ is thermal voltage, which is $k_T/q$, where k is Boltzmann's constant, $_T$ is absolute temperature in Kelvin, and q is electronic charge, and $I_1$ is the current split between the first CB cell 60 and the second CB cell 66 and where $A_{v2}$, which represents the voltage gain of the CB transistor amplifier 14, is between approximately two and three.

When the PE amplifier 100 operates in the second mode, the voltage gain $A_V$, which is a ratio of the output voltage over the input voltage, is equal to $A_{v2}$, which represents the voltage gain of the CB transistor amplifier 14, is between approximately two and three. This is a result of the low-swing cascode amplifier 12 being bypassed while the PE amplifier 100 operates in the second mode.

Stated otherwise, the PE amplifier 100 may operate as a variable-gain amplifier which is beneficial when a signal or interference is high causing desensitization issues. For example, if an amplifier compresses at approximately five dBm, the amplifier may saturate at approximately six or seven dBm; however, the gain may start falling at approximately two dBm. The PE amplifier 100 is a matched two-amplifier system (i.e., the low-swing cascode amplifier 12 is matched to the CB transistor amplifier 14 and the low-swing cascode amplifier 12 can be bypassed). This is accomplished as described above.

Figure 4:
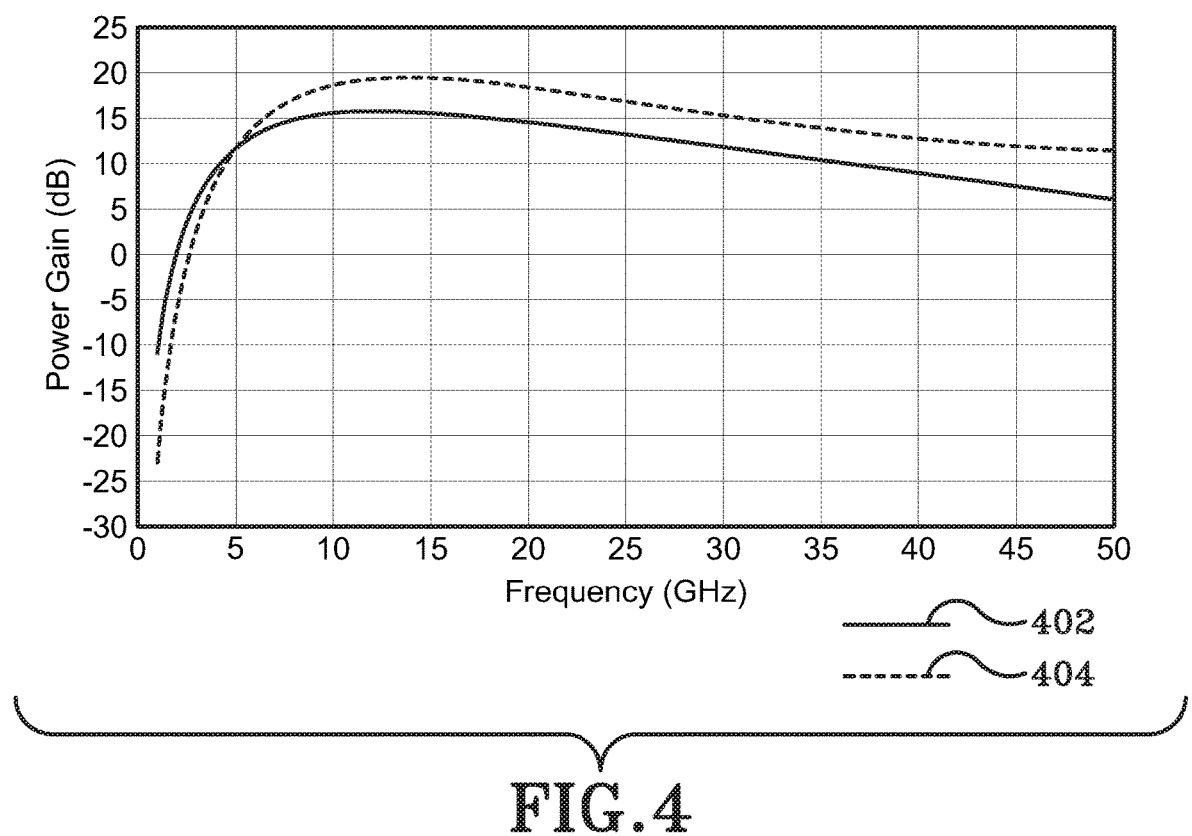
FIG. 4 is a graph of power gain in logarithmic decibel (dB) versus frequency in gigahertz (GHz) of a conventional cascode amplifier and the first embodiment of the PE amplifier.

FIG. 4 is a graph of power gain in logarithmic decibel (dB) versus frequency in gigahertz (GHz) of a conventional cascode amplifier having a voltage supply of five volts and a current of one hundred milliamps (mA) and the PE amplifier 10 having a supply voltage of three volts, a current of thirty-five mA through the pre-driver cascode amplifier 12, a current of forty mA through the CB transistor amplifier 14, a source impedance of one hundred ohms (Ω) and an output load impedance of one hundred Ω. Line 402 represents the performance of the PE amplifier 10 and line 404 represents the performance of the conventional cascode amplifier. As shown in FIG. 4, the PE amplifier 10 has greater power gain over a wide frequency range compared to the conventional cascode amplifier.

Table 1 below shows a comparison of performance characteristics of the PE amplifier 10 and the conventional cascode amplifier described in FIG. 4.

TABLE 1

| Amplifier type | Power Gain (dB) | | | | Compression Point (dBm) | | | | Reverse isolation (dB) (without package effects) | | | | Power dissipation (mW) |
| --- | --- | --- | --- | --- | --- | --- | --- | --- | --- | --- | --- | --- | --- |
| | 15 GHz | 20 GHz | 30 GHz | 40 GHz | 15 GHz | 20 GHz | 30 GHz | 40 GHz | | | | | |
| PE amplifier | 18.5 | 18.3 | 15.3 | 12.8 | 14.9 | 15.6 | 15.0 | 14.25 | 98 | 93 | 83 | 76 | 330 |
| Conventional cascode Amplifier | 15.6 | 14.6 | 11.9 | 9.0 | 15.8 | 15.4 | 14.2 | 14.0 | 43 | 41 | 37 | 35 | 500 |

As shown in Table 1, the PE amplifier 10 has greater power gain, improved reverse isolation (without package effects, which are defined as inherent effects of a packaged amplifier), and improved power dissipation compared to the conventional cascode amplifier.

Therefore, some of the benefits of the PE amplifiers 10, 100 of the present disclosure include, but are not limited to, being able to operate with a voltage supply of three volts at, among others, microwave and millimeter-wave frequencies, being able to swing a three volt peak differential, having improved reverse isolation compared to a conventional cascode amplifier, and being able to re-optimize bias current in the pre-driver cascode amplifier 12 bottom device to save power.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A power efficient (PE) amplifier comprising:
   a cascode amplifier;
   a common base (CB) transistor amplifier;
   at least one voltage supply;
   wherein the CB transistor amplifier comprises:
   a plurality of transformers; wherein each of the plurality of transformers includes a primary and a secondary; wherein each primary is connected in series; wherein each secondary includes a secondary center tap;

at least one plurality of differential pairs of transistors; wherein each transistor of each of the at least one plurality of differential pairs of transistors includes a base terminal, an emitter terminal, and a collector terminal; wherein one secondary of the plurality of transformers is connected across the emitter terminals of each of the transistors of each of the at least one plurality of differential pairs of transistors; wherein the collector terminals of each of the transistors of each of the at least one plurality of differential pairs of transistors are connected in parallel;

a primary center tap in the series connection of the plurality of transformers; wherein the at least one voltage supply is connected to the primary center tap; wherein the at least one voltage supply supplies at least one first current to the cascode amplifier from the primary center tap; and a plurality of current sources providing a total CB transistor amplifier current; wherein each secondary center tap of the plurality of transformers is connected to one of the plurality of current sources; and wherein each secondary carries a fraction of the total CB transistor amplifier current.

2. The PE amplifier of claim 1, further comprising:
a voltage of the at least one voltage supply; wherein the voltage is approximately three volts.

3. The PE amplifier of claim 2, further comprising:
a three volt peak differential swing equal to the voltage of the at least one voltage supply.

4. The PE amplifier of claim 1, wherein the total CB transistor amplifier current is split substantially equally between each transistor of each of the at least one plurality of differential pairs of transistors.

5. The PE amplifier of claim 1, further comprising:
an input impedance presented by the CB transistor amplifier; and
an output impedance presented by the cascode amplifier; wherein the input impedance presented by the CB transistor amplifier is substantially matched to the output impedance of the cascode amplifier.

6. The PE amplifier of claim 1, further comprising:
a gain of the PE amplifier; and
at least one switching mechanism; wherein the at least one switching mechanism switches on and off to vary the gain.

7. The PE amplifier of claim 6, further comprising:
an input impedance of the PE amplifier; wherein when the gain varies the input impedance remains unchanged.

8. The PE amplifier of claim 6, further comprising:
an output impedance of the PE amplifier; wherein when the gain varies the output impedance remains unchanged.

9. The PE amplifier of claim 1, further comprising:
a radio frequency (RF) source impedance;
an input impedance presented by the CB transistor amplifier; and
at least one switching mechanism; wherein the at least one switching mechanism is operatively coupled to the cascode amplifier; wherein the at least one switching mechanism is operably coupled to the CB transistor amplifier; wherein the at least one switching mechanism is configured to selectively bypass the cascode amplifier; and wherein when the cascode amplifier is bypassed, the input impedance presented by the CB transistor amplifier is substantially matched to the RF source impedance.

10. The PE amplifier of claim 9, further comprising:
an output impedance presented by the CB transistor amplifier; wherein when the cascode amplifier is bypassed, the output impedance presented by the CB transistor amplifier remains unchanged.

11. A power efficient (PE) amplifier comprising:
a cascode amplifier;
a common gate (CG) transistor amplifier;
at least one voltage supply;
wherein the CG transistor amplifier comprises:
a plurality of transformers; wherein each of the plurality of transformers includes a primary and a secondary; wherein each primary is connected in series; wherein each secondary includes a secondary center tap;

at least one a plurality of differential pairs of transistors; wherein each transistor of each of the at least one plurality of differential pairs of transistors includes a gate terminal, a source terminal, and a drain terminal; wherein one secondary of the plurality of transformers is connected across the source terminals of each of the transistors of each of the at least one plurality of differential pairs of transistors; wherein the drain terminals of each of the transistors of each of the at least one plurality of differential pairs of transistors are connected in parallel;

a primary center tap in the series connection of the plurality of transformers; wherein the at least one voltage supply is connected to the primary center tap; wherein the at least one voltage supply supplies at least one first current to the cascode amplifier from the primary center tap; and a plurality of current sources providing a total CG transistor amplifier current; wherein each secondary center tap of the plurality of transformers is connected to one of the plurality of current sources; and wherein each secondary carries a fraction of the total CG transistor amplifier current.

12. The PE amplifier of claim 11, further comprising:
a voltage of the at least one voltage supply; wherein the voltage is approximately three volts.

13. The PE amplifier of claim 11, further comprising:
a three volt peak differential swing equal to the voltage of the at least one voltage supply.

14. The PE amplifier of claim 11, wherein the total CG transistor amplifier current is split substantially equally between each transistor of each of the at least one plurality of differential pairs of transistors.

15. The PE amplifier of claim 11, further comprising:
an input impedance presented by the CG transistor amplifier; and
an output impedance presented by the cascode amplifier; wherein the input impedance presented by the CG transistor amplifier is substantially matched to the output impedance of the cascode amplifier.

16. The PE amplifier of claim 11, further comprising:
a gain of the PE amplifier; and
at least one switching mechanism; wherein the at least one switching mechanism switches on and off to vary the gain.

17. The PE amplifier of claim 16, further comprising:
an input impedance of the PE amplifier; wherein when the gain varies the input impedance remains unchanged.

18. The PE amplifier of claim 16, further comprising:
an output impedance of the PE amplifier; wherein when the gain varies the output impedance remains unchanged.

19. The PE amplifier of claim 11, further comprising:
a radio frequency (RF) source impedance;
an input impedance presented by the CG transistor amplifier;
at least one switching mechanism; wherein the at least one switching mechanism is operatively coupled to the cascode amplifier; wherein the at least one switching mechanism is operably coupled to the CG transistor amplifier; wherein the at least one switching mechanism is configured to selectively bypass the cascode amplifier; and wherein when the cascode amplifier is bypassed, the input impedance presented by the CG transistor amplifier is substantially matched to the RF source impedance.

20. The PE amplifier of claim 19, further comprising:
an output impedance presented by the CG transistor amplifier; wherein when the cascode amplifier is bypassed, the output impedance presented by the CG transistor amplifier remains unchanged.

* * * * *